United States Patent
Chung et al.

(10) Patent No.: US 7,879,648 B1
(45) Date of Patent: Feb. 1, 2011

(54) FABRICATION METHOD FOR HIGH PIN COUNT CHIP PACKAGE

(75) Inventors: Hsing-Der Chung, Hsinchu (TW); Hung-Hsin Hsu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/688,389

(22) Filed: Jan. 15, 2010

(30) Foreign Application Priority Data

Oct. 27, 2009 (TW) ............................... 98136273 A

(51) Int. Cl.
*H01L 21/00* (2006.01)
(52) U.S. Cl. .................. 438/112; 438/123; 438/124; 257/E21.51; 257/E21.499
(58) Field of Classification Search ............... 438/112, 438/123, 124; 257/E21.51, E21.499
See application file for complete search history.

(56) References Cited

U.S. PATENT DOCUMENTS 6,498,392 B2 * 12/2002 Azuma ...................... 257/676
2002/0153585 A1 * 10/2002 Asano et al. ............... 257/472
2005/0073031 A1 * 4/2005 Abe et al. .................. 257/666
2009/0243054 A1 * 10/2009 Yeung et al. ............... 257/666

* cited by examiner

*Primary Examiner*—Trung Dang
(74) *Attorney, Agent, or Firm*—Muncy, Geissler, Olds & Lowe, PLLC

(57) ABSTRACT

A fabrication method for a high pin count chip package is provided herein. First, a lead frame is provided, wherein the lead frame has a chip carrier and a plurality of first lead pins configured around the chip carrier. A first channel is formed on the first lead pins to define a first contact portions and a second contact portion. A die mounting process, a wire bonding process, and a molding process are performed in turn, wherein the molding compound is utilized to encapsulate the chip, the wires, and the first channel. After that, a backside sawing process is performed to electrically isolate the first contact portions and the second contact portions. The present invention achieves high pin count chip package without changing the appearance and size of product and the reasonable width limitation of the lead pins.

9 Claims, 4 Drawing Sheets

FABRICATION METHOD FOR HIGH PIN COUNT CHIP PACKAGE

BACKGROUND OF THE INVENTION

1. Field of the Invention

The present invention relates to a fabrication method for a chip package, especially to a fabrication method for a high pin count chip package.

2. Description of the Prior Art

Electrical products with compact sizes have been a demanding trend for customers with improvement in technology. While the performance of integrated circuit keeps improving, the integrated circuit carriers also need improved. QFN (Quad Flat Non-lead) package, a package technology using lead frames, is now more popular because of its lower e-parasitic effects, thermal resistance and less package size and weight without fewer components. The conventional QFN lead frame adopts single-row lead pins and is not sufficient for usage since customers have expected higher pin count and high density lead frame design.

SUMMARY OF THE INVENTION

The present invention is directed to provide a fabrication method for a high pin count chip package. Without changing the appearance and size of product and the reasonable width limitation of the lead pins, the present invention achieves high pin count chip package by forming a channel on the upper surface of the lead frame and electrically isolating the lead pins by removing the connecting portion of the lead frame underneath the channel.

According to an embodiment, a fabrication method for a high pin count chip package, including providing a leadframe, wherein the leadframe comprises a chip carrier and a plurality of first lead pins configured around the chip carrier; forming a first channel on the first lead pins to define a first contact portion and a second contact portion thereon, wherein the first contact portion and the second contact portion are respectively located at two sides of the first channel; and the first contact portion and the second contact portion of the same first lead pin are connected to each other with a connecting portion; mounting at least one chip onto the chip carrier; performing a wire bonding process for electrically connecting the chip to the first contact portions and the chip to the second portions with a plurality of wires; encapsulating the chip, the wires, and the first channel with a molding compound; and performing a backside sawing process for electrically isolating the first contact portions and the second contact portions.

Other advantages of the present invention will become apparent from the following descriptions taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed descriptions, when taken in conjunction with the accompanying drawings, wherein:

FIGS. 3A-2 is an A-A cross-section view of FIGS. 3A-1; and

FIGS. 3B-2 is a B-B cross-section view of FIGS. 3B-1.

DESCRIPTION OF THE PREFERRED EMBODIMENT

The described embodiments are for illustrative purposes only and not intended to limit the claimed design to the features of the present invention.

Figure 1A:
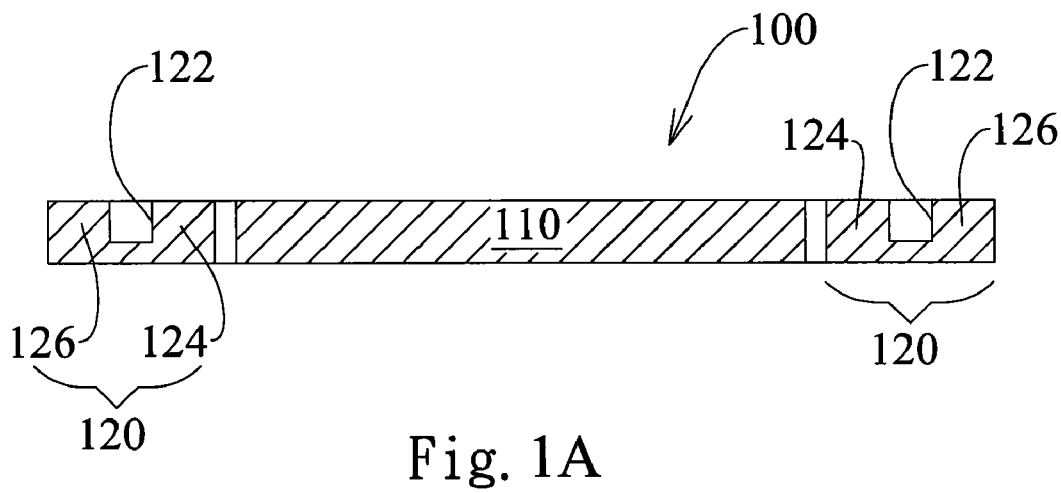
FIGS. 1A to 1D are structural schematic diagrams respectively illustrating a fabrication method for a high pin count chip package according to one embodiment of the present invention.
Figure 1B:
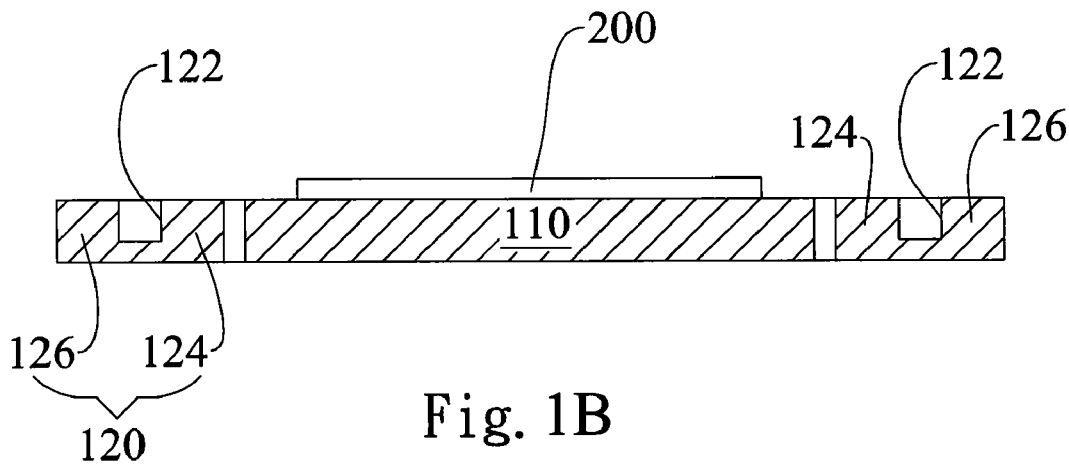
Figure 1C:
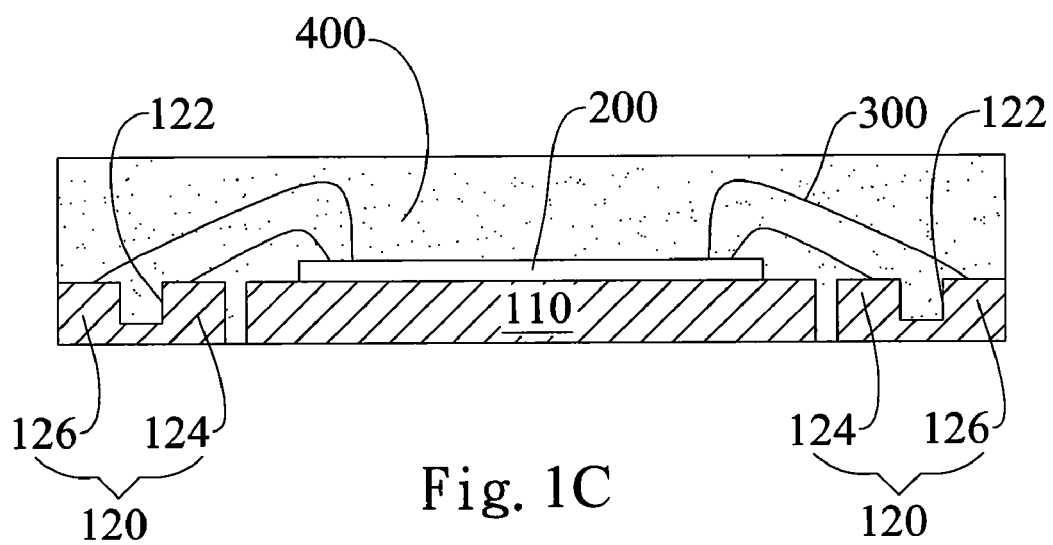
Figure 1D:
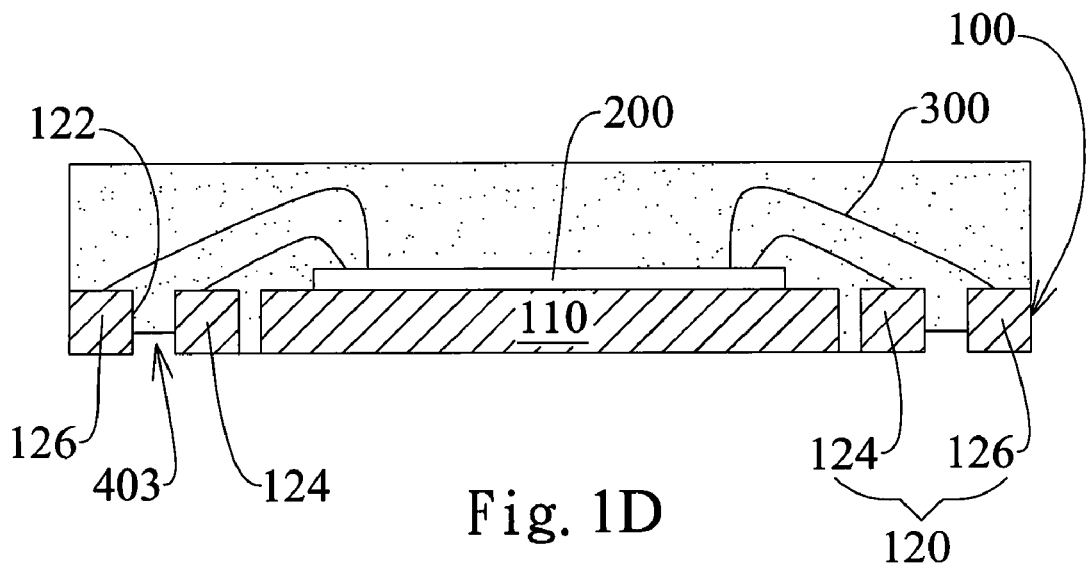

Refer to FIGS. 1A to 1D, which are structural schematic diagrams respectively illustrating a fabrication method for a high pin count chip package according to one embodiment of the present invention. A fabrication method for a high pin count chip package is herein provided in the present invention. Firstly, as illustrated in FIG. 1A, a lead frame 100 having a chip carrier 110 and a plurality of first lead pins 120 configured around the chip carrier 110 is provided. A first channel 122 is then formed on the first lead pins 120 to define a first contact portion 124 and a second contact portion 126 thereon, wherein the first contact portion 124 and the second contact portion 126 are respectively located at two sides of the first channel 122 and the first contact portion 124 and the second contact portion 126 on the same lead pin are connected to each other with a connecting portion.) The first channel 122 is formed by etching in this embodiment; however, it is not thus limited. At least one chip 200 is then mounted onto the chip carrier 110 as illustrated in FIG. 1B. As illustrated in FIG. 1C, a wire bonding process is next performed by electrically connecting the chip 200 to the first contact portions 124 and the chip 200 to the second portions 126 with a plurality of wires 300. Next, the chip 200, the wires 300, the first contact portions 124, the second contact portions 126 and the channel 122 are encapsulated with a molding compound 400. A backside sawing process is then performed, as illustrated in FIG. 1D, for electrically isolating the first contact portions 124 and the second contact portions 126.

Following the above description, in one embodiment, the connecting portion between the first contact portions 124 and the second contact portions 126 is cut off to expose a portion of molding compound 400 located at the bottom of the channel 122 in the backside sawing process. Furthermore, refer to both FIG. 1D and FIG. 2, which is a schematic diagram illustrating a lower surface of a high pin count chip package after package. As illustrated, a plurality of cutting tracks 401, 402 corresponding to position of the channel 122 are formed on the lower surface of the package structure by the backside sawing process after packaging. After removing the lead frame or the molding compound on the cutting tracks 401, 402, multiple trenches 403 are formed on the lower surface of the package structure. In one embodiment, the trenches 403 are formed by cutting along the cutting tracks 401, 402 for electrically isolating the first contact portions 124 and the second contact portions 126. The cutting depth depends on the depth of the connecting portion between the first contact portion 124 and the second contact portion 126. It is understood that the first contact portions 124 and the second contact portions 126 may be electrically isolated by drilling, boring and so on. The present invention may adopt a commercially available lead frame without changing the appearance and size thereof, and form high pin count chip package with the remain portion of the lead frame by forming channels on the upper surface of the lead frame and removing the portion of the lead frames beneath the channel after packaging. The method of the present invention may provide double lead pins or more in comparison to conventional lead frames without increasing processing complexity.

Figure 2:
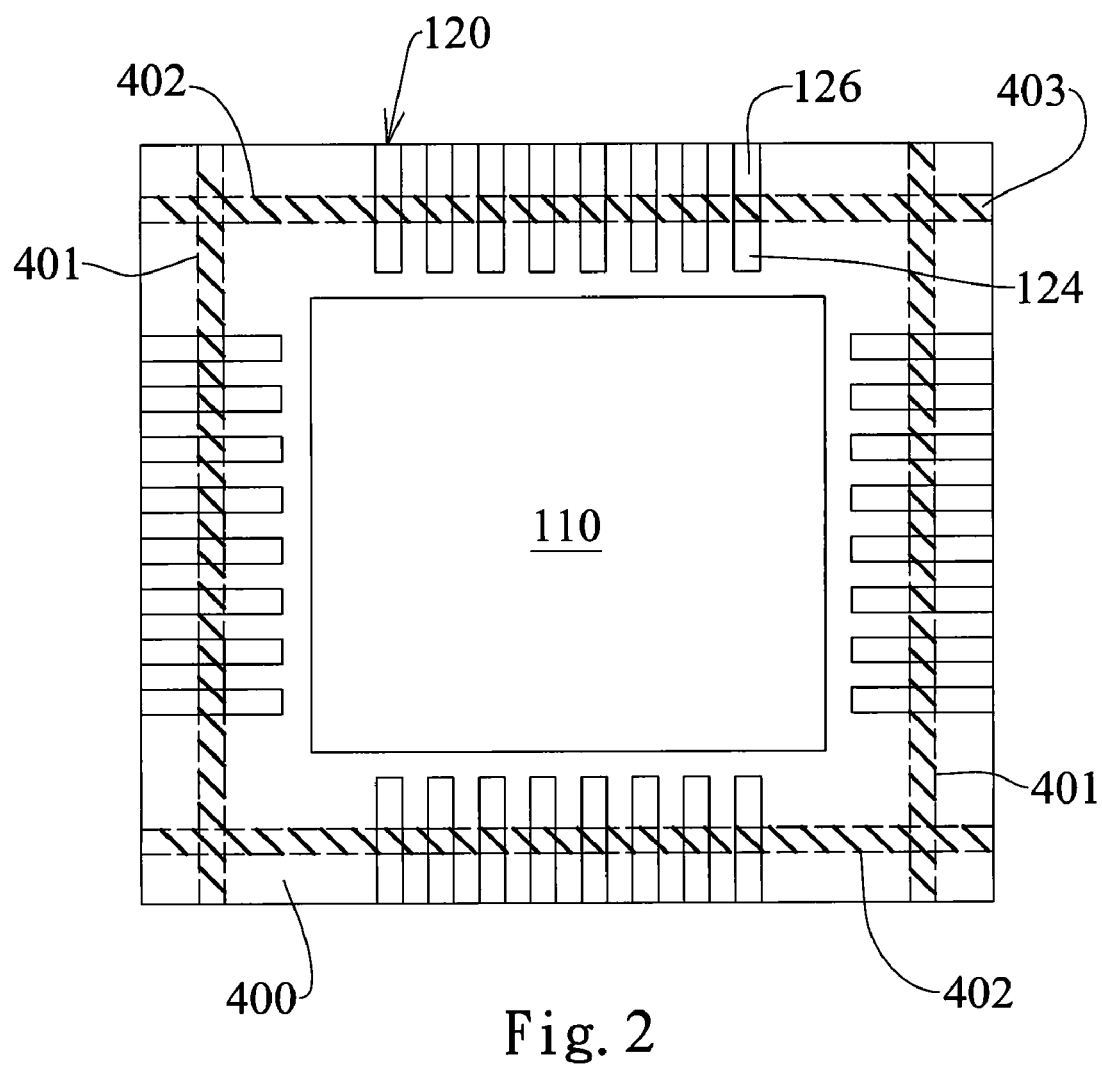
FIG. 2 is a schematic diagram illustrating a lower surface of a high pin count chip package after package.
Figures 1, 3A:
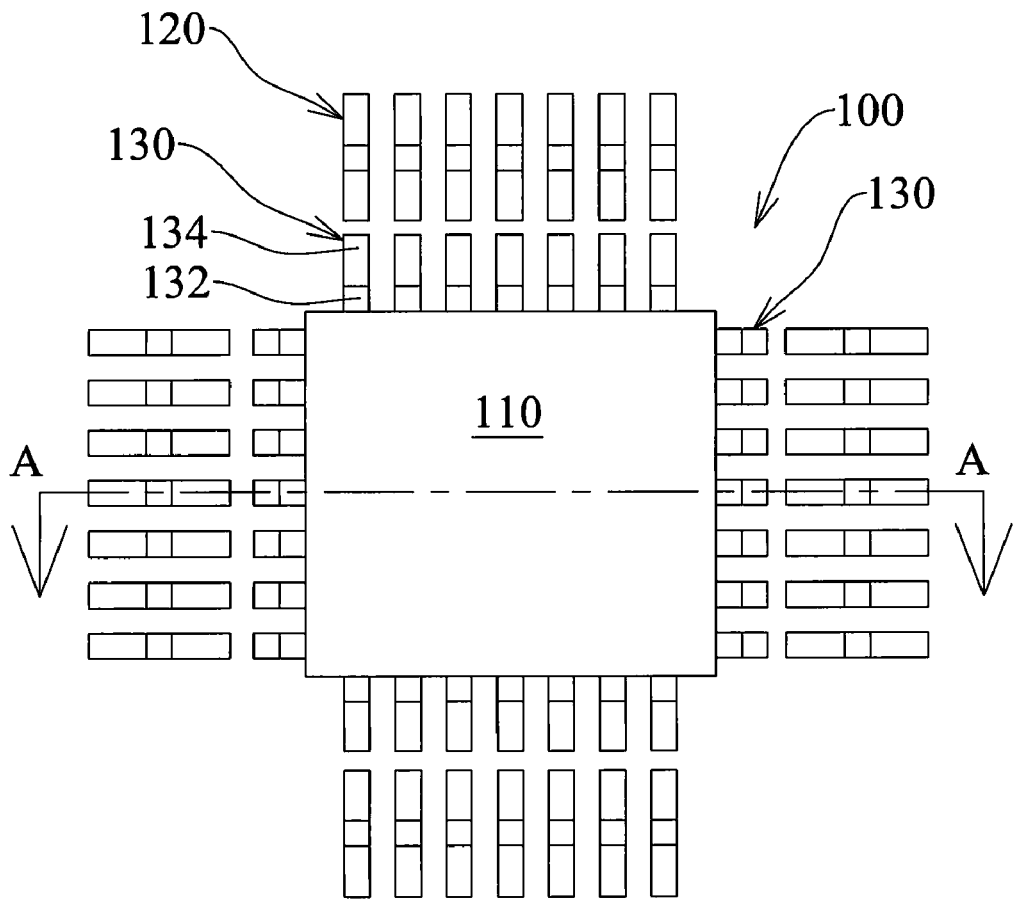
FIGS. 3A-1 and 3B-1 are structural schematic diagrams of a fabrication method for the high pin count chip package structure according to one embodiment of the present invention.
Figures 2, 3A:
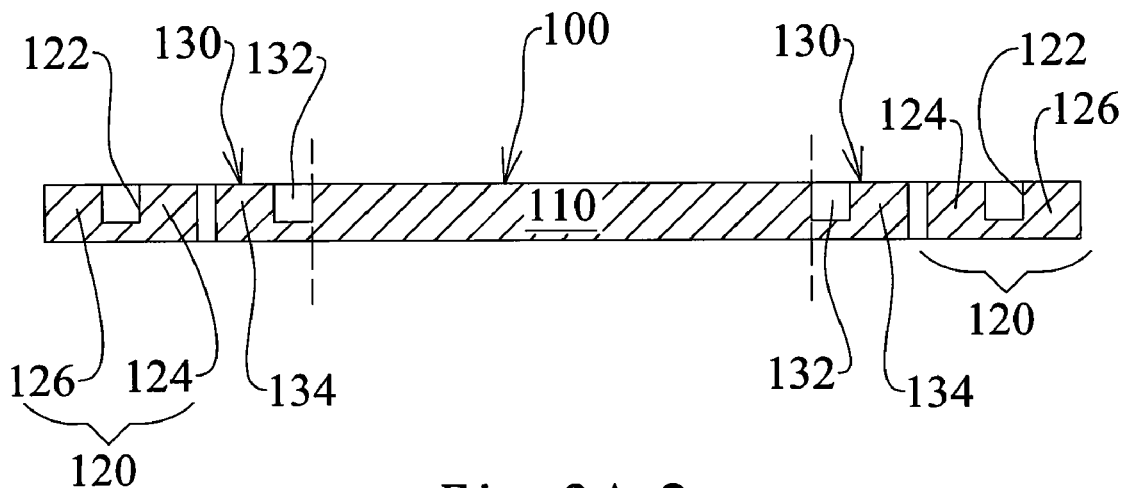
Figures 1, 3B:
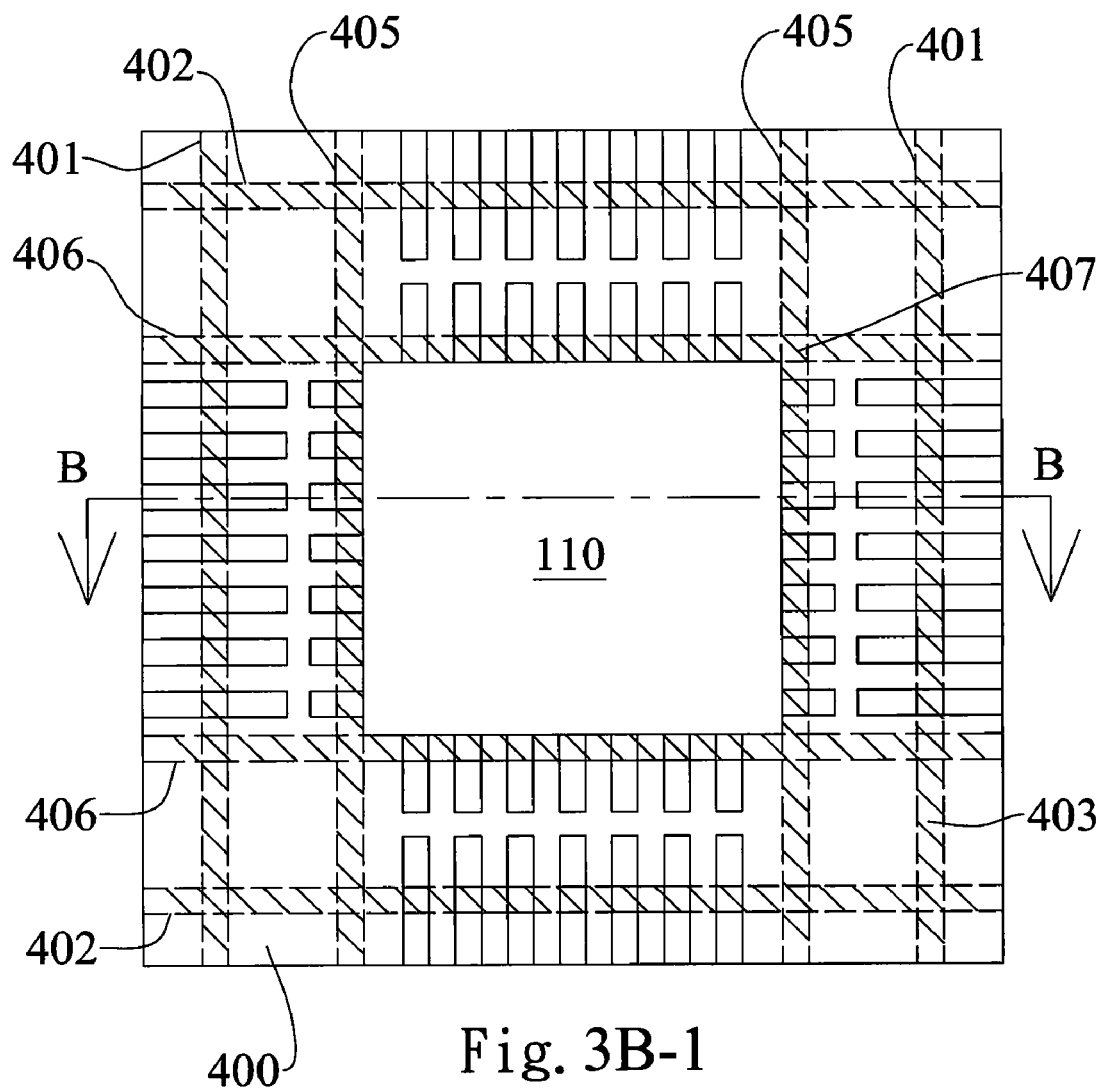
Figures 2, 3B:
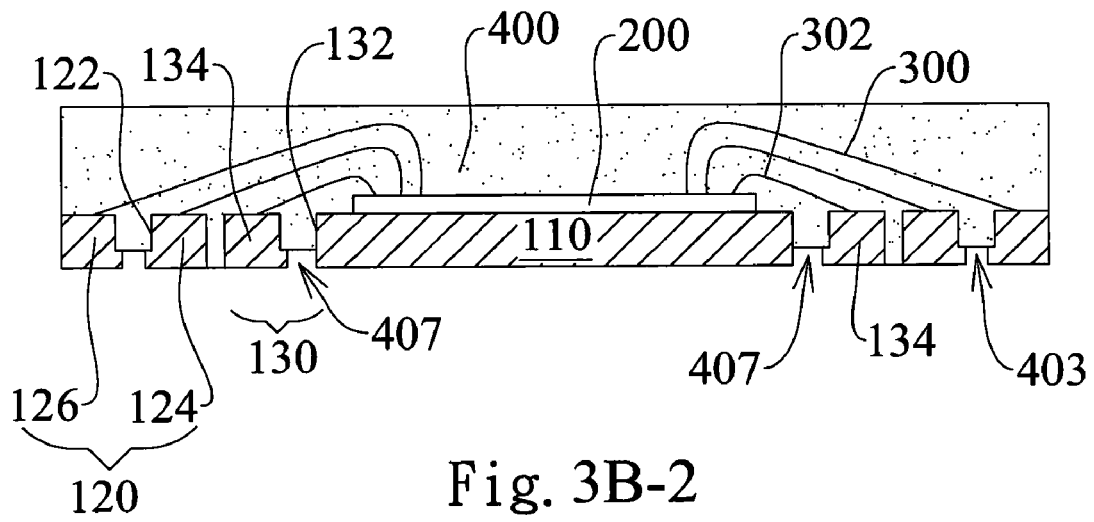

Next, refer to FIGS. 3A-1, 3A-2, 3B-1 and 3B-2, which are structural schematic diagrams and sectional views of a fabrication method for the high pin count chip package structure according to one embodiment of the present invention. FIG. 3A-1 and FIGS. 3B-1 are respectively schematic diagrams illustrating the lower surface of the lead frame at different stages and the lower surface of the lower surface of the high pin count chip package. This present embodiment differs from the above embodiment in that the above mentioned lead frame 100 further includes a plurality of second lead pins 130 configured on the periphery of the chip carrier 110 and connected to the chip carrier 110, as illustrated in FIGS. 3A-1 and FIGS. 3A-2, which is an A-A cross-section view of FIGS. 3A-1. Thus, a second channel 132 is formed between the second lead pins 130 and the chip carrier 110 to form a third contact portion 134 on each of the second lead pins 130. Next, referring to FIGS. 3B-1 and FIGS. 3B-2, the chip 200 and a portion of the third contact portions 134 are electrically connected by wire bonding after die mounting. The filled molding compound 400 encapsulates the third contact portions 134 and substantially fills the second channel 132. Each of the connecting portions between the second lead pins 130 and chip carrier 110 is also removed during backside sawing for electrically isolating the chip carrier 110 and the third contact portions 134. In one embodiment, each of the connecting portions between the second lead pins 130 and the chip carrier 110 is cut off for electrically isolating the chip carrier 110 and third contact portions 134.

In this embodiment, as illustrated in FIGS. 3B-1 and FIGS. 3B-2, a plurality of cutting tracks 405, 406 corresponding to the position of the second channel 132 are formed on the lower surface of the package structure by the backside sawing process after packaging. A plurality of trenches 407 are formed by cutting away the lead frame or the molding compound along the cutting tracks 405, 406 for electrically isolating the chip carrier 110 and the third contact portions 134.

The fabrication method of the present invention may be utilized to have double or even more than triple lead pins in comparison to conventional design and these lead pins can pair with higher I/O chips to generate IC products with higher specifications and yet more compact sizes.

Furthermore, in this embodiment, the cutting tracks 405, 406 are perpendicular to each other and surround the chip carrier 110 to form latticed trenches 407 surrounding the chip carrier 110, as illustrated in FIGS. 3B-1. Accordingly, the cutting tracks 401, 402 are perpendicular to each other to form latticed trenches 403.

To sum up, without changing the appearance and size of product and the reasonable width limitation of the lead pins, the present invention achieves high pin count chip package by forming a channel on the upper surface of the lead frame and electrically isolating the lead pins by removing the connecting portion of the lead frame underneath the channel.

While the invention can be subject to various modifications and alternative forms, a specific example thereof has been shown in the drawings and is herein described in detail. It should be understood, however, that the invention is not to be limited to the particular form disclosed, but on the contrary, the invention is to cover all modifications, equivalents, and alternatives falling within the spirit and scope of the appended claims.

What is claimed is:

1. A fabrication method for a high pin count chip package, comprising:
   providing a leadframe, wherein the leadframe comprises a chip carrier and a plurality of first lead pins configured around the chip carrier;
   forming a first channel on the first lead pins to define a first contact portion and a second contact portion thereon, wherein the first contact portion and the second contact portion are respectively located at two sides of the first channel; and the first contact portion and the second contact portion of the same first lead pin are connected to each other with a connecting portion;
   mounting at least one chip onto the chip carrier;
   performing a wire bonding process for electrically connecting the chip to the first contact portions and the chip to the second portions with a plurality of wires;
   encapsulating the chip, the wires, and the first channel with a molding compound; and
   performing a backside sawing process for electrically isolating the first contact portions and the second contact portions.

2. The fabrication method as claimed in claim 1, wherein the backside sawing process includes cutting away a bottom of the first lead pins to a bottom of the first channel for removing a connection portion of the first lead pins.

3. The fabrication method as claimed in claim 1, wherein the first channel is formed by etching.

4. The fabrication method as claimed in claim 1, wherein the lead frame further comprises a plurality of second lead pins configured on the periphery of the chip carrier and connected to the chip carrier.

5. The fabrication method as claimed in claim 4, further comprising:
   forming a second channel between the second lead pins and the chip carrier to form a third contact portion on each of the second lead pins.

6. The fabrication method as claimed in claim 5, wherein the wire bonding process includes electrically connecting the chip and a portion of the third contact portion.

7. The fabrication method as claimed in claim 5, wherein the molding compound encapsulates the third contact portions and substantially fills the second channel.

8. The fabrication method as claimed in claim 5, wherein the backside sawing process further comprises removing a portion of each of the second lead connected with the chip carrier for electrically isolating the chip carrier and the third contact portion.

9. The fabrication method as claimed in claim 8, wherein the portion of each of the second lead connected with the chip carrier is removed by cutting away a bottom of the second lead pins to a bottom of the second channel and a connecting portion of the second lead pins for electrically isolating the chip carrier and the third contact portions.

* * * * *